United States Patent [19]
Boys et al.

[11] Patent Number: 5,767,592
[45] Date of Patent: Jun. 16, 1998

[54] PULSE GENERATOR FOR ELECTRIC FENCES

[75] Inventors: John Talbot Boys; Andrew William Green; Robert Charles Bryan Woodhead, all of Auckland, New Zealand

[73] Assignee: Stafix Electric Fencing Limited, Auckland, New Zealand

[21] Appl. No.: 693,168

[22] PCT Filed: Oct. 18, 1994

[86] PCT No.: PCT/NZ94/00113

§ 371 Date: Aug. 14, 1996

§ 102(e) Date: Aug. 14, 1996

[87] PCT Pub. No.: WO95/11550

PCT Pub. Date: Apr. 27, 1995

[30] Foreign Application Priority Data

Oct. 22, 1993 [NZ] New Zealand .................. 250037

[51] Int. Cl.⁶ .......................................... H05C 1/04
[52] U.S. Cl. ...................... 307/108; 256/10; 361/232
[58] Field of Search .................. 307/106–108, 307/109; 361/232, 256; 256/10; 327/129; 340/564

[56] References Cited

U.S. PATENT DOCUMENTS

| | | | |
|---|---|---|---|
| 4,114,185 | 9/1978 | Gallagher et al. | 361/232 |
| 4,396,879 | 8/1983 | Weinreich et al. | 256/10 |
| 4,859,868 | 8/1989 | McKissack | 307/108 |
| 5,381,298 | 1/1995 | Shaw et al. | 361/232 |

*Primary Examiner*—Richard T. Elms
*Attorney, Agent, or Firm*—Young & Thompson

[57] ABSTRACT

A circuit (700) for an electric fence energizer (examples are 6 or 24 Joule versions) which synthesizes a pulse having a raised cosine waveform at a first or bus voltage uses a ferrite-cored output transformer (701) to multiply the voltage of the pulse to the required level. A raised cosine waveform has a low harmonic content and little filtering of high-power pulses is required in order to minimize electromagnetic emissions. On closure of a switch (707) in series with an inductor (705) a first capacitor bank (703) commences charging a second smaller capacitor bank (704) in parallel with the output primary and after the peak of the pulse any remaining charge is dissipated in a resistor (708) with the aid of a saturable inductor (702), acting as a switch. The saturable inductor may be the output transformer itself for lower output energizers. The output exhibits little or any reversal of polarity when matched to its load. The circuit may also be useful for applications such as strobe flashers in aircraft.

11 Claims, 11 Drawing Sheets

PULSE GENERATOR FOR ELECTRIC FENCES

BACKGROUND OF THE INVENTION

This invention relates to the field of generation of power electric pulses of low harmonic content suitable for use in the control of fenced livestock; more particularly to circuits for the generation of repetitive pulses having controlled shapes, and has particular but not exclusive application to circuits for energizers for electric fences.

DESCRIPTION OF THE RELATED ART

Wire fences electrified with intermittent pulses of electricity have been in wide use in New Zealand since at least the 1950s. This type of fence is suitable for enclosing livestock on farms, where the portability of such fences has permitted substantial improvements in management practices such as that of break-feeding a paddock to a herd of cows.

In general the power supplies or energizers used with these fences convert a relatively small and steady supply of power into brief impulses of large power (often several Kilowatts) at a high voltage, typically 5KV or more, by (a) the use of slow charging of a capacitor and then its quick discharge through a gas or solid-state switch, and (b) passing the discharge current through a kind of step-up transformer. This order of magnitude of generated pulse power is required in order to cover an entire farm with a single energizer, and to cope with leakage that may occur on days when rain or dew causes insulators to exhibit surface leakage particularly across salt deposits, or when wet grass is in contact with parts of the fence. Energizers may be made to produce anywhere from one or less Joules up to about 25 Joules of energy.

One lead of the transformer secondary is connected to a farm-wide network of usually galvanised iron wires forming various fence lines; the other lead is connected to earth where currents due to leakage and capacitative charging will be found, as well as currents that have passed through animals that inadvertently touch the wire. As the power impulses are widely separated in time an animal or human has time to disengage from the fence wire before a following shock, so these fences are relatively unlikely to cause death, (as compared to a hypothetical arrangement using DC current or AC mains, for example).

In their simplest and oldest forms electric fence energizers are not unlike capacitative-discharge ignition systems for internal combustion engines. An electric fence energizer also resembles a low-frequency radio transmitter in that a source of pulsed electricity is coupled to a long aerial. A disadvantage of a simple form of electric fence energizer is that some proportion of the power driven into the fence (which is a function of proper matching) may be radiated into space as electromagnetic radiation or interference (EMI). This is also known as radio frequency interference or RFI. Past attempts to minimise this radiation, in order to comply with laws relating to EMI generally operate by filtering out harmonics of the basic pulse. The filters involved must handle the power and voltage levels involved, hence they tend to be expensive and may absorb a substantial proportion of useful energy.

There is therefore a need for an improved electric fence energizer which produces less EMI/RFI and preferably one which accomplishes this by means based on never generating interference, rather than by means based on heavy filtering, which must be at high voltage and high power levels, and hence would require high-capacity components.

There is also a requirement to ensure that electric fence energizers revert to a fail-save condition if a fault develops. As one of the main risks is that the main discharging switch, generally a silicon controlled rectifier (SCR) or thyristor, if it becomes faulty, enters a mode in which repeated discharges of powerful pulses may occur even in the absence of a deliberately generated gate pulse, there is a need to include means to minimise stresses on the thyristor(s) in the circuit as well as to detect such a condition and prevent rapidly repeated faults.

SUMMARY OF THE INVENTION

It is an object of the present invention to provide an improved circuit to generate effective electric pulses for use in electric fencing installations, and/or an energizer for an electric fence, or one which will at least provide the public with a useful choice.

In a first broad aspect the invention comprises a circuit for an electric pulse generator suitable for use in an electric fence energizer, capable from time to time of generating or constructing pulses of power having a controlled shape with a smooth and substantially symmetrical outline, comprising means to determine the shape of the pulse when generated at a first low voltage, and means to transform the pulse so generated into a pulse at a second, generally higher voltage without substantial alteration to the shape of the initially generated pulse.

Preferably the controlled shape is substantially that of a raised cosine wave.

In a related aspect the invention comprises a circuit having at least one first chargeable means connected so as to receive a charging current from a controlled source of electricity and become charged to a first voltage, thereby holding an effective charge, at least one second chargeable means connected in parallel with the first chargeable means but in series with a means possessing effective inductance and also in series with a first switching means, the second chargeable means also being connected in parallel with pulse transforming means, a discharging means in series with a charge-dissipating means and in parallel with the first chargeable means, and actuating means to control the switching means, so that in use the first chargeable means may, on closure of the first switching means, transfer its charge via the means having inductance into the second chargeable means and thus into the pulse transforming means, and shortly thereafter the discharging means will cause the transferred charge to be returned towards the charge-dissipating means, whereupon any remaining charge within the first chargeable means will be substantially dissipated within the charge dissipating means, so that in use the amplitude of the constructed pulse has a rising phase in which it rises gradually at first, then more rapidly, then slows to a rounded peak, then falls in a falling phase which is substantially a mirror image of the rising phase, resulting in a pulse of substantially smooth shape being generated.

In a subsidiary aspect to the above, the invention includes a circuit wherein the first chargeable means comprises at least one capacitor and has about twice the storage capacity of the second chargeable means, which also comprises one or more capacitors.

In a second related aspect the invention comprises a circuit in which the pulse transforming means is a transformer having a primary:secondary turns ratio capable of providing pulses at an effective output voltage and which pulse transforming means has a non-conducting ferromagnetic core such as one of a ferrite or an iron dust composition suitable for high-frequency use.

In a third related aspect the invention comprises a circuit in which the discharging means is a saturable inductor in series with an energy-dissipating means.

Alternatively the invention comprises a circuit in which the discharging means is provided as an intrinsic property of the output transformer which is provided with a saturable ferromagnetic core.

As a further alternative the invention comprises a circuit in which the discharging means is a switch in series with an energy-dissipating means.

In a fourth related aspect the invention comprises a circuit in which further means to shape the generated pulse comprise one or more means to block the reverse flow of current and thereby minimize reversal of the polarity of the waveform.

In a fifth related aspect the invention comprises a circuit in which further control means are provided to cause the construction of a pulse to occur in sequence and to minimize the risk of inadvertent generation of spurious pulses, said control means including means to control and monitor the source of the charging current, means to monitor the amount of charge placed within the first chargeable means, together with means to initiate a pulse substantially as soon as the charge reaches a predetermined level, and means to cause a pulse to be generated after a certain time even if the predetermined charge is not accomplished.

In a subsidiary aspect the invention also includes means to sense the instantaneous phase of an alternating-current mains supply in order to limit the initiation of charging to the zero-crossing intervals of the alternating-current mains supply and means to limit the generation of an output pulse to those moments when the alternating-current mains supply link is in its negative polarity so that in use a rectification means placed between the alternating input and the charging DC voltage is in a reverse biased state.

In a related aspect the invention provides a circuit for an electric pulse generator capable of generating pulses of power comprising:

- at least one first chargeable means connected so as to receive a charging current and become charged to a first voltage, thereby holding an effective charge,
- at least one second chargeable means connected in parallel with the first chargeable means but in series with a means possessing effective inductance and also in series with a first switching means, the second chargeable means also being connected in parallel with pulse transforming means,
- a discharging means in series with a charge-dissipating means, being together in parallel with the first chargeable means, and
- actuating means to control the switching means,
- so that in use the first chargeable means may, on closure of the first switching means,
- transfer its charge via the means having inductance into the second chargeable means and thus into the pulse transforming means, and shortly thereafter the discharging means will cause the transferred charge to be returned towards the charge-dissipating means,
- whereupon any remaining charge within the first chargeable means will be substantially dissipated within the charge dissipating means, resulting in a pulse of substantially smooth shape being generated.

Preferably the chargeable means are capacitors and preferably the first chargeable means has about twice the storage capacity of the second chargeable means. Optionally the capacitors may be made up of smaller units connected in series or in parallel.

Preferably the switching means is one or more solid-state switches of the type known as thyristors or silicon controlled rectifiers. Optionally more than one solid-state switch may be used in parallel configurations.

Preferably the discharging means is a saturable inductor, though alternatively it may be a solid-state switch.

Preferably the means possessing inductance comprises one or more inductors.

Preferably the pulse transforming means is a transformer having a primary:secondary turns ratio capable of providing pulses at an effective output voltage, and preferably the transformer has a non-conducting ferromagnetic core suitable for high-frequency use, for example a powdered iron core or a core of ferrite.

Optionally the second switching means may be a saturating inductance. Preferably this is a discrete device but for units whose output capacity is smaller it may be an intrinsic property of the output transformer.

In a related aspect the invention is a pulse-generating circuit as described, including further devices to prevent reverse flow of current, or alternatively to allow the reverse flow of inadvertently created current.

In a further related aspect the invention is a pulse-generating circuit including control means to minimize the risk of inadvertent generation of spurious pulses, said means including means to restrict the charging of the first chargeable means until immediately before a pulse is to be generated, means to monitor the amount of charge placed within the first chargeable means, together with means to create a pulse as soon as the charge reaches a predetermined level, and means to cause a pulse to be generated after a certain time even if the predetermined charge is not accomplished.

In a yet further aspect, RFI fed into the main supply is minimized by synchronising the generation of output pulses to occur during the half-cycle of the mains input when a diode placed between the alternating input and the high DC voltage is in a reverse biased state.

Alternatively interference may be minimized by causing-output pulses to be generated substantially at zero-crossing instants of the supply so that possible interference is unable to pass through semiconductors when in a non-conducting state as at such instants.

Alternatively the invention may include control means to restrict the commencement and the termination of the charging process and the moment of creation of the pulse to occur substantially at zero-crossing instants of the incoming AC mains so that in use minimal RFI is generated and fed into the AC mains supply;

In a third broad aspect the invention comprises a method for generating a pulse of high voltage having a controlled shape by first generating the pulse at a first lower voltage and determining its shape substantially at that first lower voltage, and then transforming it to a higher voltage.

Preferably the controlled shape exhibits smooth outlines and a substantially symmetrical shape. A preferred shape has a raised cosine waveform, or a sigmoid curve-like outline, that is, it resembles the shape of a normal-distribution curve, with a gradual commencement and a gradual termination.

Preferably the pulse has a duration of approximately 180 microseconds, though the preferred range extends from about double to about half of that duration.

In a related aspect the invention comprises a method for generating a pulse of a controlled shape including the steps of controlling the rate of rise and the final height of the rising portion of the pulse, from a base level up to a peak amplitude, by passing a charge from a first charged electrical storage means into a second uncharged electrical storage means through a means having inductance and through a switch, and then controlling the rate of fall of the pulse from its peak down to the basal level by returning the charge from the second storage means back to the first, now relatively discharged storage means and into charge dissipating means, with some assistance from resonance effects in the circuit.

In a supplementary aspect the invention comprises a method of operation of a circuit comprising the steps of: commencing the charging of a first capacitor, determining when the charge has reached a predetermined level, discharging the charge through at least one inductor having a selected inductance into a second capacitor of preferably substantially half the capacitance of the first capacitor, and then shorting out the first capacitor until the charge in the circuit has returned to it and been dissipated, meanwhile extracting a pulse output from across the second capacitor via a primary winding of an optimizing transformer which produces an output pulse of a desired voltage, current, and duration.

Optionally the ratio of capacitance of the first and second capacitances may be other than two to one.

Preferably the amplitude and duration of the pulse is optimized in order to provide an effective waveform for use in an electric fence installation.

Preferably the harmonic content of the pulse is minimized in order to minimize spurious radiation of electromagnetic interference. In effect this means that the pulse changes amplitude at a slowly varying rate, and tends to be smooth and symmetrical.

Preferably means are provided in order to minimize undershooting of the waveform below the baseline, or a reversal of the original polarity of the pulse, even if the impedance of the fence is poorly matched to the impedance of the generator.

Preferably the instants of commencing the charging process and of commencing the pulse formation process are synchronised with zero-crossing instants of the incoming AC mains, in order to minimize electromagnetic interference that may be propagated within the mains supply.

Optionally the invention provides a method for minimising the RFI fed into the mains supply by synchronizing the generation of output pulses to lie in the half-cycle when the voltage doubler diode is in a reverse biased state.

Optionally the second switching means may be a saturating inductance. Preferably this is a discrete device but for units whose output capacity is smaller it may be an intrinsic property of the output transformer.

In a further supplementary aspect the invention comprises a method of preventing or at least minimising the amount of electromagnetic interference passed from interference-generating equipment through a rectifier and back into the mains by synchronizing the times at which interference is likely to be generated with zero-crossing instants of the mains supply so that interference so generated cannot pass through the rectifier elements which are at such instants in a substantially high-impedance state.

In a related aspect the rectifier elements are preferably of the fast-recovery type having minimal stored charge at or near the semiconductor junction or junctions, or at least use additional rectifier elements that exhibit the property of fast recovery.

In a related aspect the invention comprises the above method when used in an electric fence energizer.

BRIEF DESCRIPTION OF THE DRAWINGS

The following is a description of a preferred form of the invention, given by way of example only, with reference to the accompanying diagrams.

DESCRIPTION OF THE PREFERRED EMBODIMENT

Figure 1:
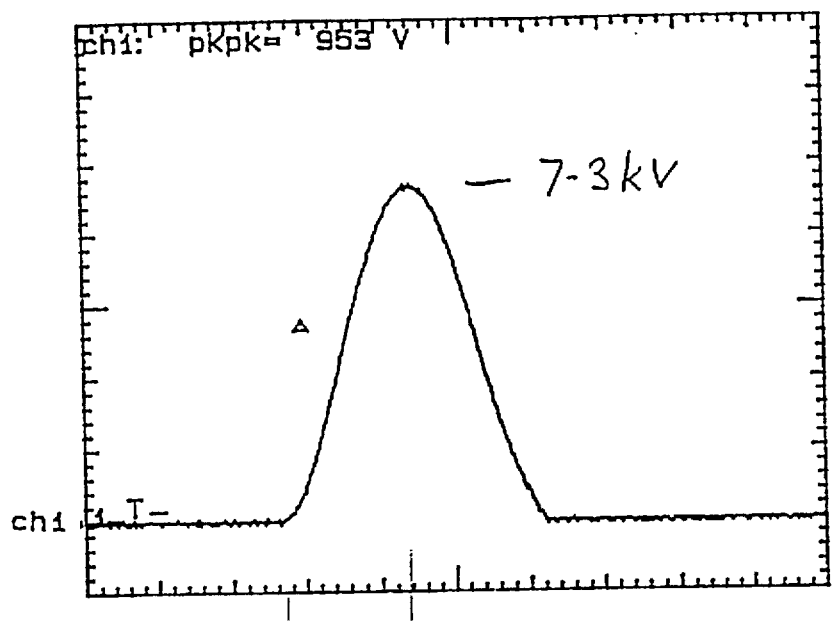
FIG. 1: is an oscillogram of a pulse produced by the circuit of this invention.

An electric fence energizer is in principle a device to produce a brief pulse of high-voltage electricity at a relatively high power, useful for distribution within fence wiring over a wide area such as an entire farm. We shall outline the principles of most energizers, compared and contrasted with our circuit and describe some preferred embodiments of electric fence energizers.

The preferred operating principle includes storage of a charge of electricity in one or more capacitors, building up the charge over a relatively long period, then discharge of the capacitor through a switch and then a step-up transformer primary winding in a relatively short time, so concentrating the current and limiting (by virtue of capacitor capacity) the quantity of electricity in the pulse. This principle is also widely used in electronic (strobe) flash photography, capacitative discharge ignition, and the like.

In several ways the design of an electric fence energizer include balancing a desired effect against an undesired consequence. For example the balancing of power output (more is better) against safety (less is better), or the balancing of power output against electrical interference especially radio frequency interference (RFI). Many countries impose regulatory constraints to provide for safety and low emissions.

The exponential waveform generated by a simple, prior art capacitative discharge type of energizer (see FIG. 4) seeking to come close to power limits is clearly likely to create RFI/EMI. The harmonic content of the sharp rise to the peak is particularly bad. Prior-art solutions to the RFI problem involve intensive filtering or actual clamping of this abrupt rise and it is estimated that the added expense and the wasted output implicit in such filtering are commonly both of the order of 20%.

Some previous attempts to generate a pulse initially free of harmonics have claimed to provide a power-handling resonant circuit about the output transformer, so that the pulse as generated resembles a sine wave. Some problems associated with that approach include that the beginning and particularly the end of the pulse possess sharp transitions, that as the main storage capacitor is incompletely discharged that the circuit may continue to resonate and thereby deliver a dangerous train of output pulses, and that high circulating currents exist The novel circuit of the high-voltage pulse generator of this invention has been developed to construct a substantially symmetrical output pulse that substantially represents a raised cosine wave, having an effective duration and amplitude.

The present invention has been devised for the reliable, high-power, construction of widely separated single shaped pulses, applicable for example to electric fence energizers. The shape of any one of our constructed pulses is that of a raised cosine wave with a gradual onset and gradual termination of voltage or current; thus the nominally 160 microseconds pulse that we prefer to generate has a minimal harmonic content above its fundamental "frequency" of around 6 KHz. This pulse-construction approach minimizes radio-frequency power generation without provision of many filtering components which is an advantage, as filtering a high-power pulse is an inefficient and expensive procedure.

Resonance is not believed to be implicated in the construction of a pulse. One trap to inhibit resonance comprises a diode 706 in inverse parallel connection across the inductor 701 (see FIG. 7).

The circuit output is supplied from a finite energy source—a charged capacitor—not an infinite energy source such as the mains supply. The stored capacitor charge sets the output energy of the pulse. It is useful to completely discharge the capacitor at the end of each pulse, in order to minimize hazards and to maximise the peak energy. In small fence units (such as the 6 Joule example) we build the output transformer so that its core will enter saturation, while in large units a separate saturable inductor is preferred as a means to discharge the capacitor, as in the 24 Joule example.

The capacitance ratio between the storage capacitor 703 and the capacitor 704 across the inductor 701 is about 2:1. Both capacitors are preferably non-electrolytic pulse capacitors, typically with a polycarbonate dielectric. The capacitors may be made up from a bank of individual units, preferably using 30 µF 1000 V units.

We have further discovered that the use of a preferred powdered-iron core (or any other high-frequency core material such as most ferrites) in the pulse transformer 701 is advantageous in that the generated pulse is transformed to another voltage without significant deterioration of the waveform. Prior art energizers generally relied on laminated iron transformer cores which are relatively expensive and have poor efficiency at higher frequencies—although that may have been one part of a low-pass filtering process. Powdered iron cores are readily available and are generally less expensive than comparable ferrite cores.

The output of an electric fence energizer is limited by safety constraints enshrined in various legislation, such as (for a New Zealand example) that the maximum energy is 8 Joules into a 500 ohm load, and that the amount of electricity (product of current and time) should be less than 2.5 milliCoulombs. In effect, these constraints minimize the maximum voltage. There is a preferred pulse length of about 200 microseconds (µS)—determined by effectiveness. Furthermore there is legislation to control the amount of radio-frequency interference (RFI) that can be generated by an energizer, as measured in a standard test jig. These regulations have in the past been difficult to satisfy.

The electric fence energizer of this invention uses as a starting source of electric power various alternatives such as battery power, (for which sections relating to zero-crossing of mains input are clearly irrelevant) or locally generated power or mains power as convenient, and comprises:

(a) a controlled rectifier, voltage monitor, and SCR triggering circuits and triggering monitors, to produce a high-voltage DC charging current; preferably of the order of 800 V for a high-power energizer and preferably including safety functions which among other things prevent repeated small discharges from being generated—as by a damaged silicon controlled rectifier (SCR) having gate leakage, and (b) a high-voltage pulse generator.

In this specification, we make reference to a pulse and while the actual polarity as placed on an electric fence, for example, is not important and may be either positive or negative. We have found it convenient to refer to a positive-going pulse and to talk of an amplitude that rises to a peak from a zero baseline, while the same apparatus can generate a negative-going pulse if the secondary windings of the output transformer are connected in reverse.

PRIOR ART PULSE—GENERATING CIRCUIT

Figure 6:
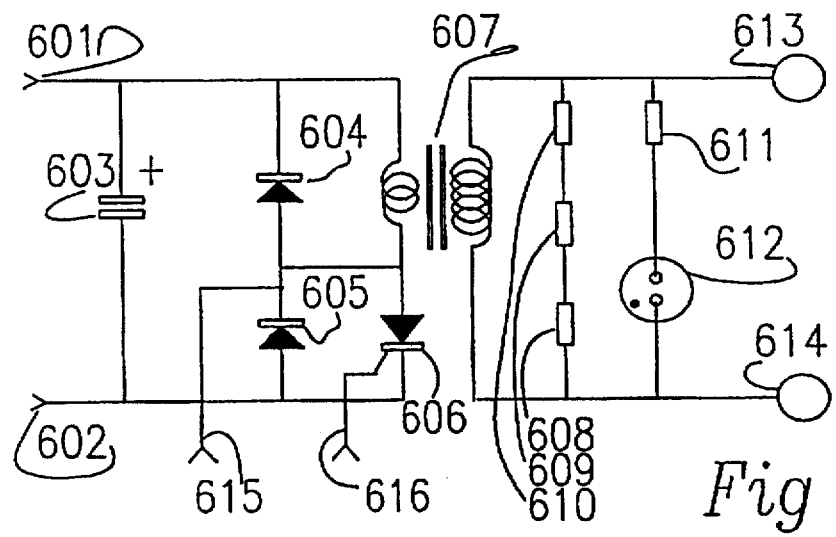
FIG. 6: is a simplified circuit of the pulse generation portion of a prior art energizer (Stafix SM3000)

An example prior art circuit is illustrated as FIG. 6; taken from the entire circuit for a Stafix SM3000 circuit diagram. 601 (positive) and 602 are inputs from a controlled rectifier/voltage doubler which charges the storage capacitor 603 to a significant voltage (about 535 V). This voltage is sensed via a chain of high-voltage Zener diodes connected between line 615 and ground. Other circuitry (not shown) also provides protection against the production of multiple pulses. When the voltage is sufficiently high to cause current to flow through the diodes, other circuitry (not shown) causes firing of the silicon controlled rectifier 616 and thereby causes the stored charge in 603 to be carried through the primary of the laminated-iron transformer 607. A higher secondary pulse is developed in the secondary winding. This is clamped by voltage-dependent resistors 608, 609, and 610; some current is bled off through the series resistor 611 and through the neon lamp 612 to serve as a visual indication of a pulse, and is then fed to the output terminals 613 and 614. Other kinds of prior art circuit provide further filtering of high frequency components of the pulse with inductors and capacitors. The voltage-dependent resistors offer only token protection against lightning damage.

EXAMPLE 1

Figure 2:
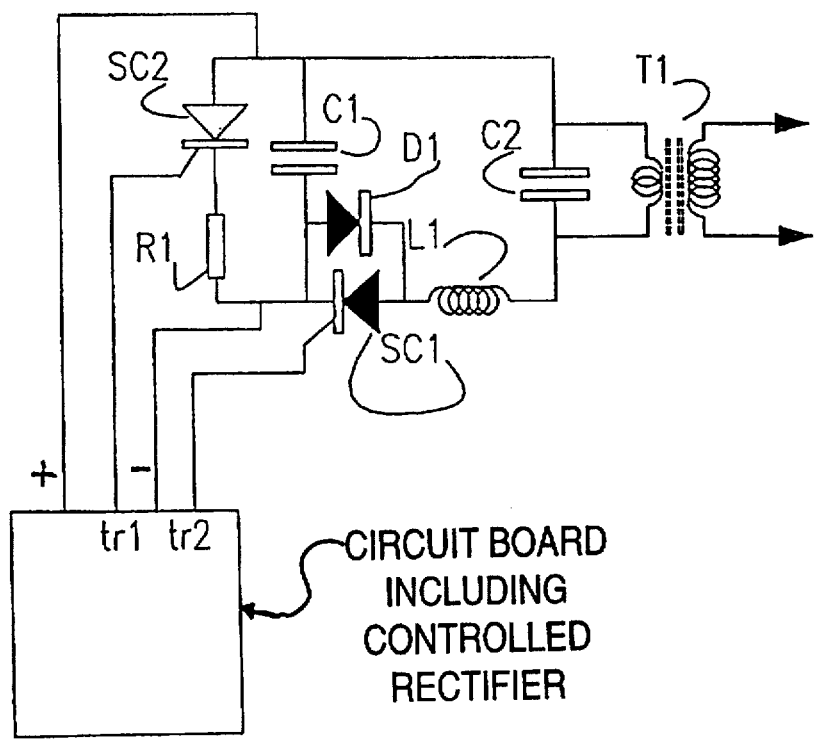
FIG. 2: is a simplified circuit diagram illustrating the principles of the present invention.
Figure 3A:
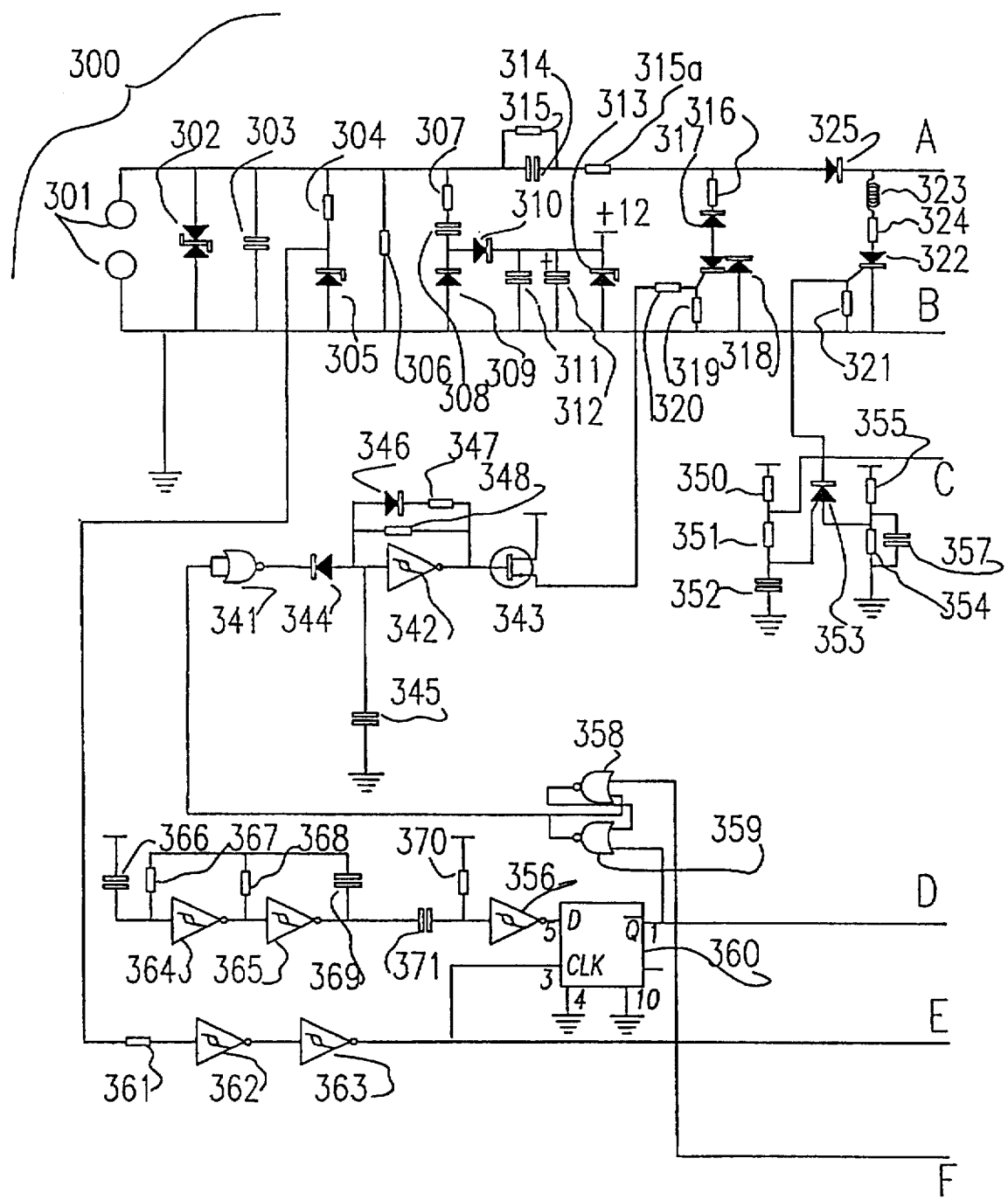
FIGS. 3a and 3b: are a circuit diagram of an embodiment of the present invention.
Figure 3B:
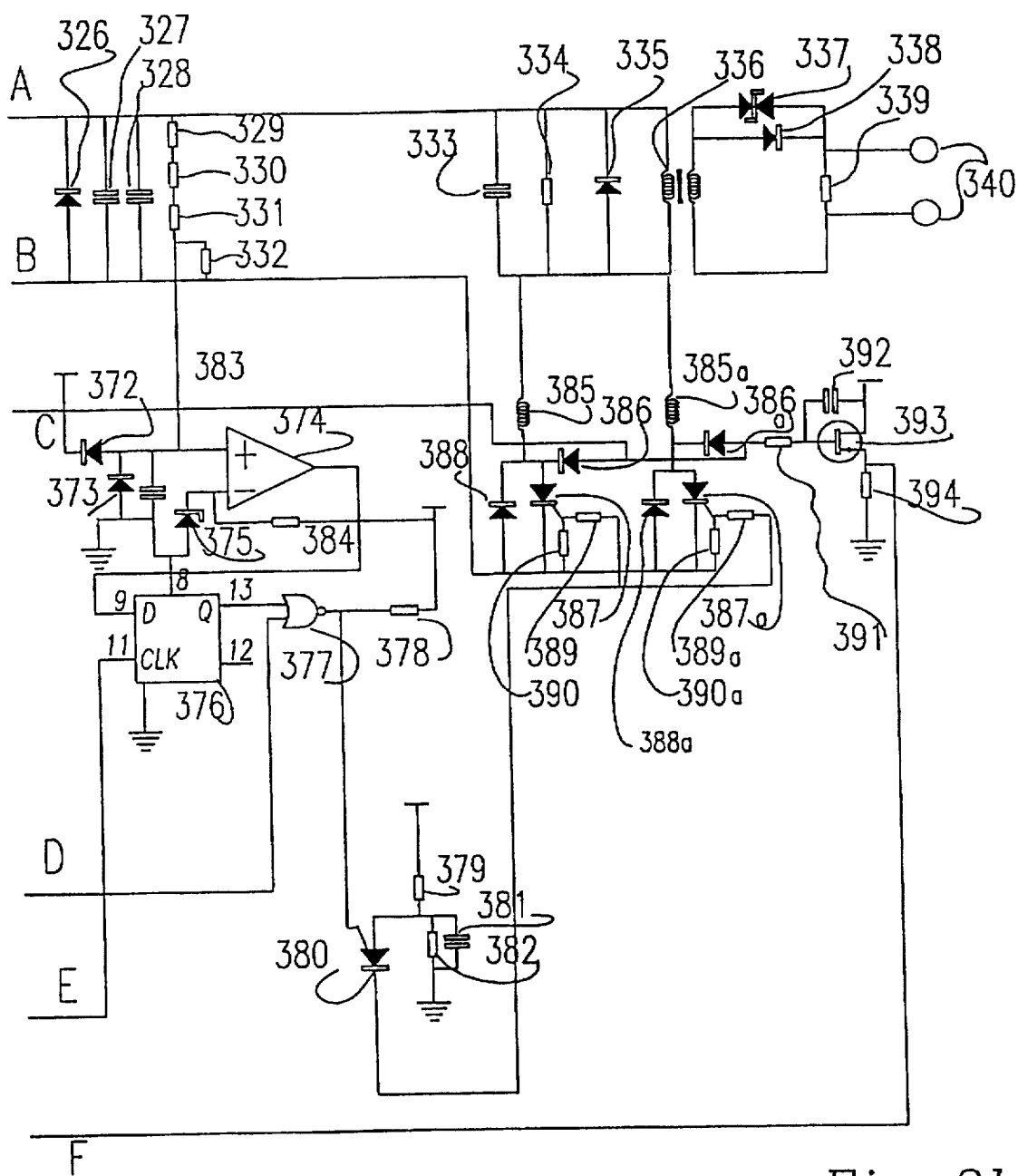

This circuit (as shown in FIGS. 2, 3a and 3b) uses an active component to discharge the capacitor across the output inductor, and in order to control that active component (a thyristor) there is also some time delay circuitry and pulse generating means.

The controlled rectifier of this invention includes a novel means for isolation of potential interference from the mains. It is known that as the alternating voltage applied to a real semiconductor diode changes polarity and passes through zero, the diode enters a non-conducting state once the applied voltage has come below the forward voltage of the diode. Hence there is a brief period (assuming full-wave rectification is in effect) during which the rectifier is non-conducting and therefore has a high impedance, so that the equipment is effectively disconnected from the mains. This invention makes use of this effect by arranging that the D-flip flop devices 360, 376, clocked by a zero-crossing detector (304, 304, 361, 362, 363), initiate the onset of charging and also the onset of the discharge pulse.

While it is sufficient to place the moment of discharge at or about the zero-crossing moments of the incoming mains supply, the large amplitudes of voltage change occurring within the fence unit may pass through the voltage doubler diode (325 of FIG. 3a) and the circuitry to determine the zero-crossing interval is not trivial. Preferably, therefore the moment of discharge is set to occur during the depth of the negative-going swing of the incoming mains, during which time the diode 325 is quite substantially reverse-biased. A simple RC delay device prior to the PUT 380 (which triggers the main discharge units) suffices to provide this delay. A reduction of the order of 60 dB has been measured.

Of course, the effect of stored charge at a P-N junction diminishes the duration of the "window" of high impedance, and for this reason semiconductors of the "fast recovery" type in which this stored charge has been minimized are preferable. Hence, as Triac devices (as 318) have inherently poor recovery characteristics, a series diode 324 of a fast-recovery avalanche type (Philips BYV56) is added.

Figure 5:
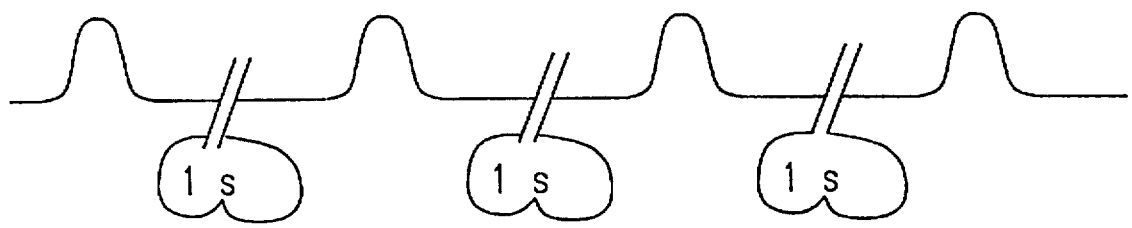
FIG. 5: illustrates a pulse train generated by the present invention.

The novel circuit of the high-voltage pulse generator of this invention has been developed to generate a substantially symmetrical output pulse that closely approximates a raised cosine wave. It is also similar to the sigmoid curve of a statistical normal distribution curve because the pulse as generated (see FIG. 1) includes a gradual onset and a gradual termination to the leading and the trailing edge of the pulse respectively, thereby minimizing the harmonic content of the power fed into the fence. An ideal pulse exhibits a slow rate of change. Further minimization of EMI/RFI is implied by the overall symmetry of the pulse. FIG. 1 illustrates a digital oscilloscope recording of such a pulse. In addition the lack of undershoot—below the baseline—at either end of the main pulse should be noted, for this further minimizes harmonics. FIG. 5 illustrates a series of such pulses as would be generated during use. Each pulse is of about 150–180 µS duration and is repeated at about 1 second intervals.

Figure 4:
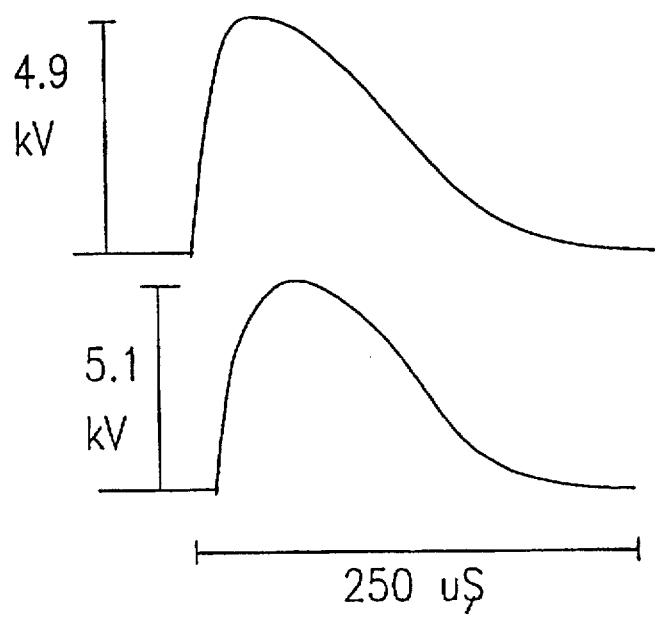
FIG. 4: illustrates prior art output pulses from two example energizers; both into 500 ohm loads.

FIG. 4 illustrates prior art energizer outputs from two example units, as oscillograms. These pulses are evidently asymmetrical, and have a relatively large rise time, especially at pulse initiation. A significant series of harmonics would be obtained if one applied Fourier analysis techniques to waveforms such as these.

FIG. 2 illustrates the principles of the pulse-generating circuit. The controlled rectifier, being prior art, is illustrated as a block and may be any source of charging current The circuit of this energizer is best explained with reference to its operating sequence.

(1) The preferred controlled rectifier (within the circuit board CB 1) charges the pulse capacitor C1 for which a preferred value for one of many sizes of energizer is 130 µF. (This capacitor and C2 are preferably a type of capacitor adapted for pulsed applications.)

(2) From time to time, such as at about one second intervals, a first SCR, SC1, connected to one end of C1 is caused to conduct.

(3) In contrast to much of the prior art, the rate of rise of discharge current is intentionally limited by (a) the inductor I1 (for which a preferred value is 20 µH) and (b) a second capacitor C2 (preferably this is half the capacitance of C1 so in this case a value may be 65 µF). The time constant of this series-resonant circuit may be adjusted by judicious selection of inductance and capacitance although the 2:1 ratio of capacitance is to be preferred.

(4) As charge builds up in, and the voltage across C2 rises, current passing through the 1:10 step-up transformer T1 rises and the first or rising half of a corresponding output pulse (see FIG. 1) is generated.

(5) At approximately the moment when the voltage across C2 has reached its peak, a second SCR (SC2) placed across C1 and in series with an energy-dumping resistor R1, preferably of about 0.4 ohms, is caused to conduct.

(6) This assists the swinging return of charge (including the collapsing flux in the inductor) from C2 back to C1, bypassing SCR 1 through the series reverse diode D1 and through the closed SCR 2 and the energy-dumping resistance. Thus the output voltage generated in the secondary of T2 falls, first gradually as a result of the inductance of I1, then more quickly, and finally more gradually again as the voltage difference between C1 and C2 tends towards zero.

(7) In order to compensate for imperfect matching, non-ideal behavior of components and/or of the electric fence driven by the energizer, a number of suppressor components are preferably installed. (These are illustrated in FIGS. 3a and 3b). A diode 338 in series with the output winding blocks reverse current flow. It may be a 200 V, 3A rectifier diode, or a zener diode, or a surge arrestor (varistor). A dummy load resistor 339 of typically 4K ohms across the output incidentally helps to cause the output to revert to zero in the event of a capacitative storage of charge in the fence. A diode 388 across the first discharge SCR 387 helps to block reverse transients, possible if the SCR has (as it should) reverted to its non-conducting state on reversal of its anode-cathode polarity. A diode 326 across C1 (also 327, 328 in FIG. 3) and a diode 335 across C2 (333) also help trap polarity reversals. These components may be termed snubbing components by analogy with the reverse diodes commonly placed across inductive loads in order to protect the semiconductors that switch their currents.

This type of circuit action may be described as a "sequential pulse constructor" in that it executes a sequential process, involving the swinging of charge from one storage unit to another, then back again, in the process of constructing a pulse. The rising and the falling portions are generated by partially separate controllable processes.

It should be noted—in contrast to conventional energizers—that at the instant of closing the first SCR (SC1) no output is generated. The output builds up gradually, as indicated with reference to the X axis in FIG. 1, as charge is transferred to C2 through L1. In conventional energizers an exponentially decaying current builds up rapidly, in the first third or less of the duration of the entire pulse.

The step-up transformer T1 preferably is low in inductance and preferably has a powdered-iron core for the sake of effectiveness, though optionally the core may be of ferrite or other materials retaining their permeability (µ) at high frequency and so suitable for high-frequency use. The transformer is required only to convert the voltage/current ratio and has a minimal incidental filtering effect. The µ of a preferred powdered iron core is 75. It has been observed that the relatively expensive laminated steel has a somewhat inferior performance when used for pulse transformation at the frequencies—approximately 6 KHz—involved. The preferred step-up ratio is 1:10 though other ratios may be selected if, for example, it is used in a battery-driven energizer. One preferred embodiment uses a powdered iron core, type E405/40 from Micrometals, Anaheim, Calif. It has 32 turns in the primary winding, 352 turns on the secondary winding, and the primary inductance is 500 μH.

In use, this circuit has been found to produce pulses of substantially similar shape when driving loads from even as low as 10 ohms up through the target value of 500 ohms and up to impedances at which the internal load resistor becomes the dominant loads Additionally, any solid-state switches (SCRs and the like) in the controlled rectifier circuit are preferably triggered when the input mains voltage passes through zero-crossing instants; having the advantage of further minimising RFI.

THE PULSE—GENERATING CIRCUIT IN MORE DETAIL

This discussion relates to the pulse circuit forming the top section of FIGS. 3a and 3b. Note that the diagram is divided in two, and lines labelled A.E in each half correspond to the severed lines. At the left side (FIG. 3a) are mains input connectors 301, and at the right side of FIG. 3b are the two pulse output terminals.

Incoming mains power is fed past a surge arrestor 302 (275 V) and a spike-filtering capacitor 303 (47F), across a 12 V zener 305 in series with a 270K resistor 304, used to develop half-cycle pulses for zero-crossing synchronisation on the control circuit. A 100K bleed resistor 306 is provided in case of parts failure. The control board (lower part of FIGS. 3a and 3b) requires a 12 V supply and this is created from the mains by tapping current through 307 (390 ohms), 308, (0.22 μF), and rectifying the current with diodes 309, 310, and clamping it to 12 V (after filtering with 309(0.22 μF, 311 (470 μF)) with a zener diode 313.

The mains power is then rectified in a controlled-rectifier voltage doubling circuit. It passes through a capacitor 314 (4μF) and series resistor 315a (60 ohm 10 W) to the rectifying diodes 317,325 (fast-recovery BYW56); where 317 is in series with a controlled rectifier or Triac 318 (type BT138-800) used as a solid-state switch for the charging of the main storage capacitor.

At this point the drive circuit for the controlled rectifier should be noted; it comprises a gated oscillator (Schmitt buffer 342—1/8 40106 together with feedback loop of 348 (220K), 347 (10K) and diode 346, 1N4148; driven through buffer 341 (1/4 4001), in series with diode 344, a 1N4148) which turns the FET ON with a further pulse every 100 microseconds (during the required period); thereby minimising RFI generation from the energizer into the mains input as could occur from TRIAC circuits driven with just a single brief pulse per mains cycle.

The anode of diode 325 (BYV56) represents a point at which a charging current at up to at least 750 V, developed from the mains by the circuit described above, is provided to the pulse generator of this invention.

The storage capacitor (as C1 of FIG. 2) is here represented by a pair of suitably rated 65 μF pulse capacitors, 327, 328 in parallel, and a diode 326 (6A10) in reverse across them (to trap undershoots). To the left of these capacitors is the means for dumping remaining charge and terminating the output pulse—corresponding to SC2 and R1 of FIG. 2. In practice, inductor 323 (10 μH) is used to limit dI/dt—the rate of rise of current through the SCR 322—type S4616NJI, and resistor 324—0.4 ohms—dissipates the unwanted energy.

The resistor chain 329 (270K, 1%), 330 (330K, 1%), 331 (100K—1%) and 332 (4K7—1%) provides a sample of the charge voltage to a voltage-sensitive discharge triggering circuit.

The return line of the circuit now passes through a paired set of discharge SCR devices, (in parallel to share the peak currents involved) 387, 387a which are type S4616NJI. Resistors 389, 389a (3 ohms), and 390, 390a (100 ohms) provide gate current limiting and return paths for any gate charge. The reverse diodes 388, 388a (type 6A10 rated at 1KV) allow the 65 μF capacitor C2 (333) to discharge and thereby generate the falling half of the pulse. Inductors 385, 385a—each being 40 μH—serve (a) to force sharing of current through the paired paths, and (b) are the inductance shown as L1 in FIG. 2, for a combination of limiting dI/dt in this circuit and providing a resonant tank circuit.

Sampling diodes 386, 386a detect a triggered pulse and the buffering source-follower FET 393 (BST100) relays this information to the control circuit.

Capacitor 333 is a single 65 μF pulse capacitor, thus providing the preferred 2:1 ratio described with reference to FIG. 2. Across this capacitor are: a damping resistor 334 (3.3 ohms), transient-trapping diode 335 (type 6A10), and the 500 μH primary of the low-inductance 1:11 ratio powdered-iron cored step-up transformer 336.

Finally, the generated pulse may be modified by passing it through a diode 338 (type BY329-120S—a 250 V type protected by a surge arrestor 337 in parallel, and a damping resistor 339 (10K) is placed across the output terminals 340. The diode in particular serves to minimize undershoot.

THE CONTROL CIRCUIT IN MORE DETAIL—FUNCTION

The way in which this circuit—in particular referring to the full circuit in FIGS. 3a and 3b also indicated as the box CB1 in FIG. 2—operates is as follows:

(1) After firing of a pulse the bidirectional controlled rectifier switch 318 is held open for a period determined by a timing circuit (364,365 and associated parts).

Thus no charge is applied at this time to the main storage capacitor (C1, or 327-328).

(2) When the timing circuit changes state, the controlled rectifier, which actually forms part of a voltage doubler circuit around the Triac 318 is closed and a charge is built up in the main capacitor.

(3) Meanwhile a sample of the rising voltage across the capacitors is sampled from the resistor chain 329,330, 331,332 and compared against 6 volts from a reference zener diode 375 by the comparator 374.

(4) When the comparator recognises equality and changes state, the pulse generation sequence is initiated at the next zero-crossing instant of the mains supply, and the controlled rectifier is also turned off via 393 and the bistable latch 358,359.

(5) In case of diminished mains supply or a voltage doubler fault, causing the rising voltage to be unable to reach the target value of 750 V, the timing circuit output is also fed across via the NOR gate 377 to the programmable unijunction (PUT) transistor 380 and causes it to emit a pulse which fires the main discharge SCRs 387, 387a, even though the output pulse will be of a lower than intended value.

Thus the main capacitor is not left in a charged state over a long period during which false triggering might occur.

Furthermore each pulse carries the same amount of charge as a constant-charge triggering point is ensured as described herein, to initiate discharge.

THE CONTROL CIRCUIT IN MORE DETAIL— STRUCTURE

Considering FIG. 3a first and taking the above pulse-handling circuit description as read; The leftmost line takes mains-synchronous pulses via a limiting resistor 361 (33K) to a chain of Schmitt inverters (362, 363) in order to generate clock signals to drive D-flip flops 360, 376 (type 4013). The purpose of this section is to cause the controlled rectifier to act at zero crossing of the mains supply and thereby minimize RFI generation at the Triac.

The oscillator to drive the Triac has been described above. It is caused to act by a signal from the bistable latch constructed from gates 358, 359; (1/2 4001) which is set OFF by a signal from the pulse-detecting FET 393, and set ON by buffered output from the conventional free-running pulse generator circuit of inverting buffers 364, 365, in which capacitor 369 (1 µF) and resistors 366, 367 (560K, 470K) set a cycle time of approximately 1 second. This timer initiates a pulse generation sequence by causing the storage capacitors to become charged.

This timer also causes a pulse to be generated in any case (even in the absence of sufficient charge voltage) through its output being coupled via D-flip-flop 360 to the NOR gate 377 which drives the PUT 380 (2N6027) which is the only route for triggering the main discharge SCRs, 387, 387a. The PUT dumps charge from the capacitor 381 (0.47 µF) built up from 12 V applied across a resistor chain 379(47K) and 382 (68K) into the SCR gates.

The comparator (374) circuit, which compares a fraction of the main charge voltage with the voltage across a 6 V reference zener (375) in series with a resistor 384, also includes protective diodes 372 and 373 (1N4148).

Finally, discharge of the charge-dumping SCR 322 is caused by the network around PUT 353 (2N6927), in which a triggering pulse formed at the moment of discharge of the main SCRs, 387, 387a is coupled through a RC delay (350; 1K, 351, 1.2K, 352, 160 nF) to the PUT. This gives a time delay of 80 µS to the discharging portion of the sequence which corresponds to the peaking of the waveform.

Advantages of this entire circuit for an electric fence energizer include that:

(1) The shape of the output pulse is idealized, as a raised half cosine wave, and substantially matches the low-voltage pulse as generated. Little or no filtering of the pulse once it exists at high voltage levels is required. This results in less wasted power and the energizer needs no expensive filter components.

(2) The peak current flowing through the SCRs 822, 822a is limited, typically to 500 A and has a gradual onset; whereas prior art energizer circuits of similar output power levels may impose instantaneous 1500A pulses that have presented a particular challenge to SCR manufacturers.

(3) Powdered iron step-up transformers are cheaper and more efficient than lamination-based transformers.

(4) Novel means to effectively limit RFI from being propagated through the mains supply are included.

(5) Attaining suitable output levels in an efficient and reliable way follows from the above advantages.

EXAMPLE 2

This circuit (as shown in summary in FIGS. 7 and 8, and in detail in FIGS. 12 to 16) uses a passive component to discharge the capacitor across the output inductor, and thus there is no need to provide pulse-generating means in order to construct the falling part of the output waveform.

Figure 7:
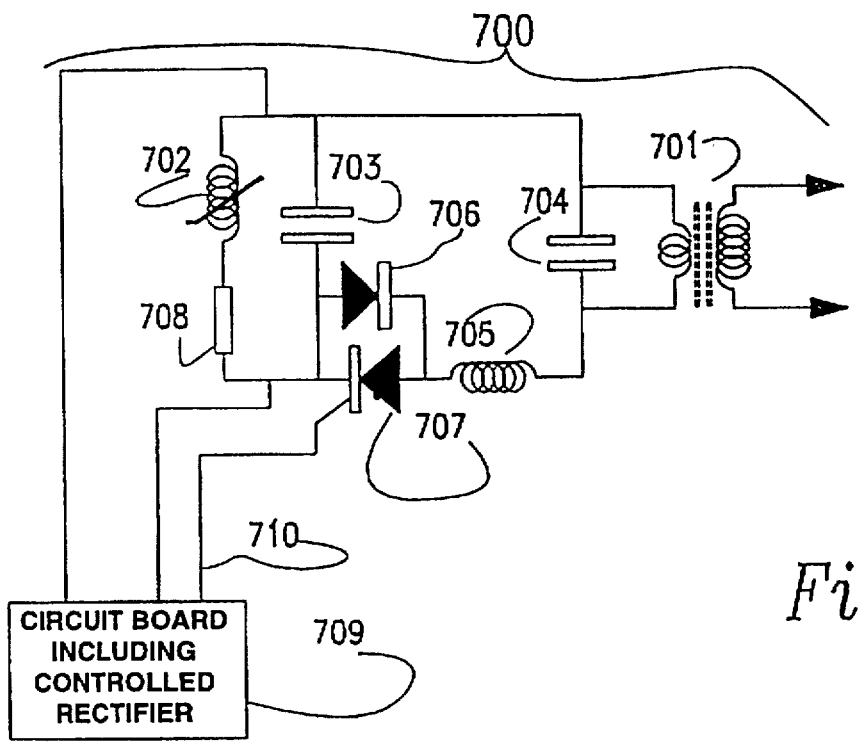
FIG. 7: illustrates, in simplified form, the saturable inductor version of a 24 Joule electric fence energizer.
Figure 8:
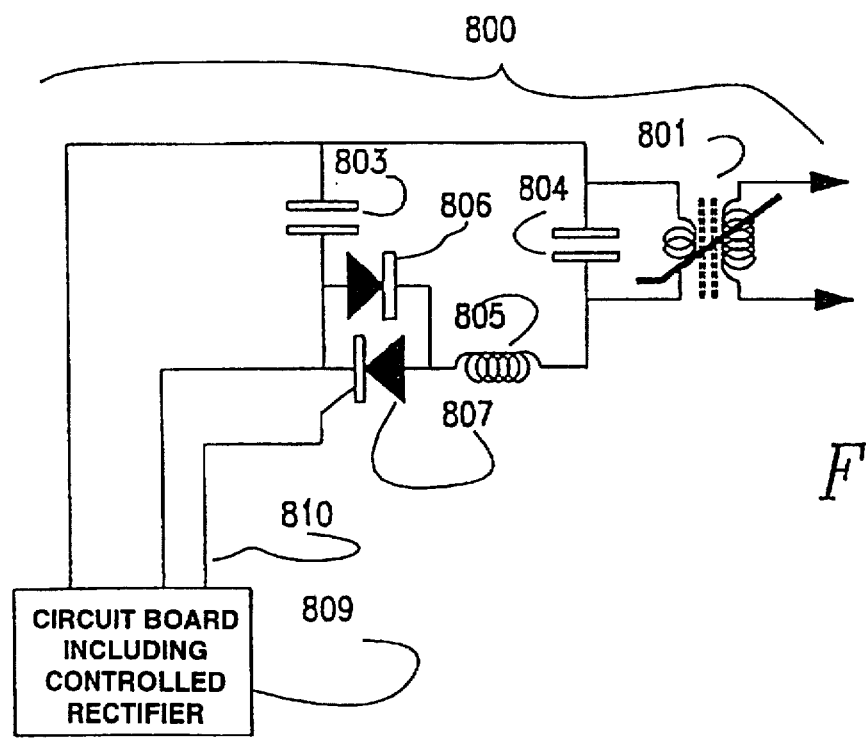
FIG. 8: illustrates, in simplified form, the saturable inductor version of a 6 Joule electric fence energizer.

This modification to the circuit of Example 1 replaces the charge dumping semiconductor of (5) above—i.e. thyristor 322 and its triggering circuit about the PUT 353—with a saturable inductor 702, connected as shown in FIG. 7 across the primary winding of the output transformer 701, although in units having smaller outputs (e.g. 6 Joules rating) it may be set up as shown in FIG. 8 where the output transformer itself is designed to become saturated and thereby discharge the capacitor across it. (In designing prototypes of larger units we have found that saturation of the main transformer overloads other semiconductors, though design or component improvements may overcome this).

A preferred saturable inductor 702 for a 24 Joule unit comprises an E225 core of powdered iron. Its windings comprise a pair of 50-turn windings of about 1 mm insulated wire connected in parallel and wound on a split bobbin. This exhibits an 11:1 ratio of inductances; 500 µH below saturation and 40 µH above. (The primary of the output transformer is also about 500 µH).

Construction of an output pulse proceeds as follows:

The two capacitor banks—as for the description of Example 1—allow the charge first placed in 703 to swing across to 704 when the thyristor 707 is closed, while the rate of rise is limited by the series inductor 705 and the slowdown at the peak is caused by approaching equality of charge voltage. Once the charge reaches the peak voltage the saturable inductor 702 becomes saturated and its much lowered inductance allows a greater flow of discharge current to pass through it and the series dumping resistor 708, so that the voltage across the output transformer primary now begins to fall and continues to fall until it reaches substantially zero output. The onset pf the fall and the termination of the fall are again controlled by circuit parameters at the beginning and the approach of the charge to zero volts at the end of the pulse.

The provision of a parallel pair of windings (not shown in the circuit diagram) within the discrete saturable inductor provides redundancy in case of failure of one winding, in order to meet the test requirements for fence units which include a requirement that deletion of any component shall not put the unit in a dangerous state. This passive component does in any case have a higher reliability than the alternative of Example 1, using thyristor 322, and precise timing of its gate pulse is not an issue if a saturable inductor is used instead.

An electric fence energizer according to this circuit may also include extra features such as audible and/or visual indications of output power.

Figure 9:
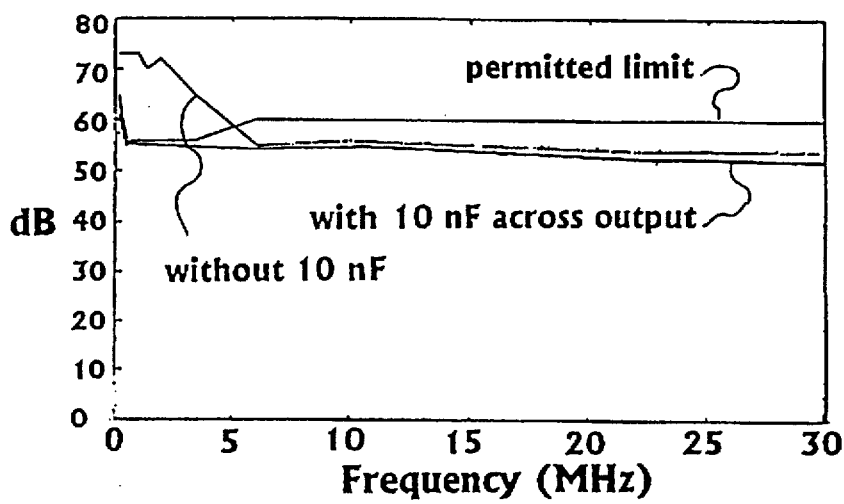
FIGS. 9, 10 and 11: illustrate some test results of the noise output from the energizer according to the standard test NZ S3124.1:1993
Figure 10:
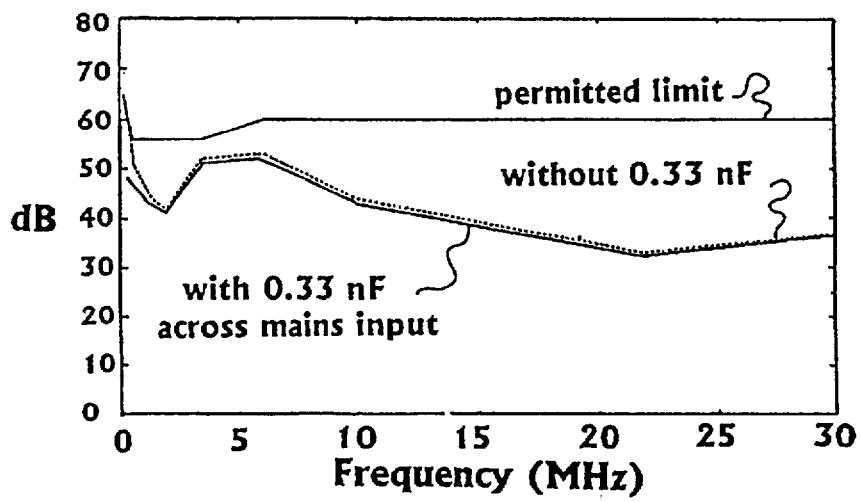
Figure 11:
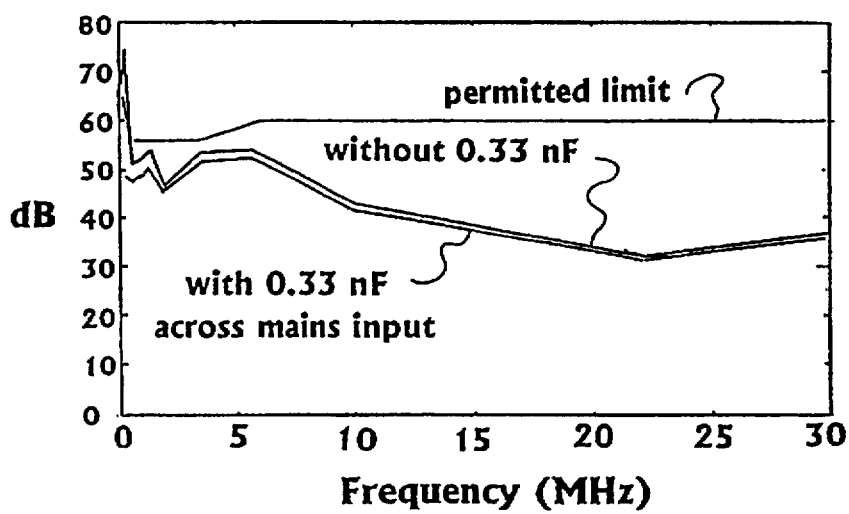

FIGS. 9, 10, and 11 illustrate the results of tests carried out at a test laboratory (IRL) in Christchurch in accordance with the standard test NZ S3124.1:1993. FIG. 9 illustrates the "Load noise" test; a graph of frequency distribution (from 0–30 MHz) of emitted noise into a prescribed test load, (as per CISPR clause 5.3.6) in relation to a permitted output. It can be seen that the addition of a 10 nF high-voltage capacitor across the output terminals brought the emitted RFI below the permitted limits at the low end of the frequency spectrurm. FIG. 10 illustrates the RFI fed into the phase lead of the mains input Here it can be seen that a 0.33 µF capacitor across the input further reduced the RFI emitted by the circuit. FIG. 11 illustrates the RFI emitted into the neutral lead of the mains circuit, and again this is substantially below the permitted limit, particularly with the addition of a 0.33 nF capacitor.

Details of a more preferred circuit (including saturable inductors) for energizers of both 6 and 24 Joule capacity are now discussed, mainly with reference to differences over the earlier circuit. FIGS. 12, 13, 14, 15 and 16 apply. These circuits include some duplication in order to seek fail-safe operation.

MAINS—INPUT POWER SUPPLY

Figure 12:
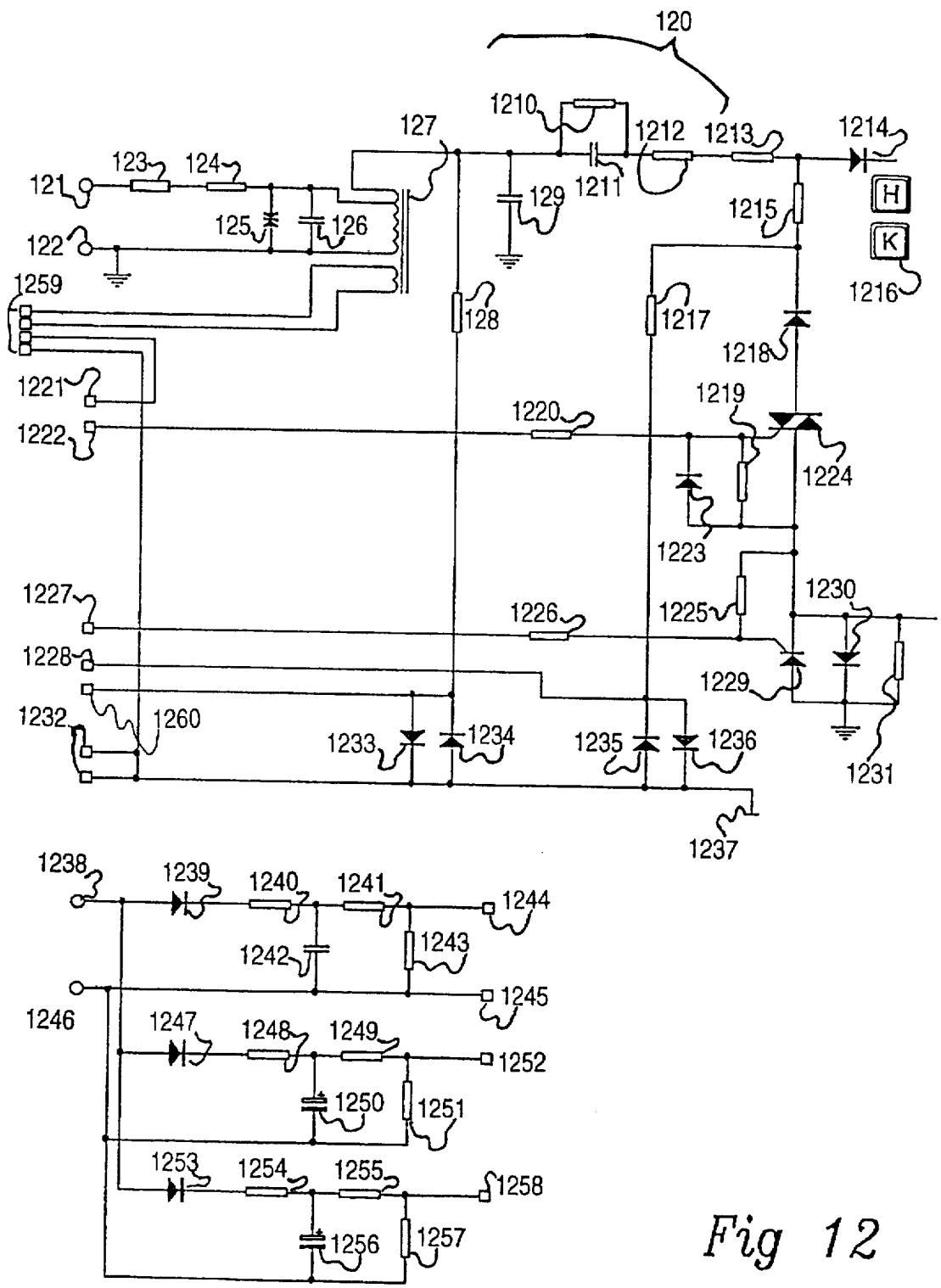
FIG. 12: illustrates a circuit diagram for the charging portion of an electric fence energizer, for either 6 or 24 Joules, in which a transformer raises the incoming mains voltage for the internal bus.

FIG. 12 illustrates an example power supply section, taking input from the mains (at 121, 122) and when enabled, generating about 750 V at its output—the point labelled H, K for the purpose of charging the pulse capacitors. The input section includes a fuse 123, series resistor 124, surge arrestor 125 and a transient filter 126, and passes the mains through a step up autotransformer 127 which has a first output of about 350 V RMS and a second isolated output of about 15 V RMS. A transformer may be preferred in this example particularly for use in countries with 117 V mains supplies to provide a high enough working voltage. (Example 3 uses a diode multiplication chain instead). The 15 V output is taken to a sub-circuit (not shown) at 1259 which generates 12 V DC for the control circuitry using a conventional rectifier, three-terminal 12 volt regulator, and filtering capacitors.

Figure 16:
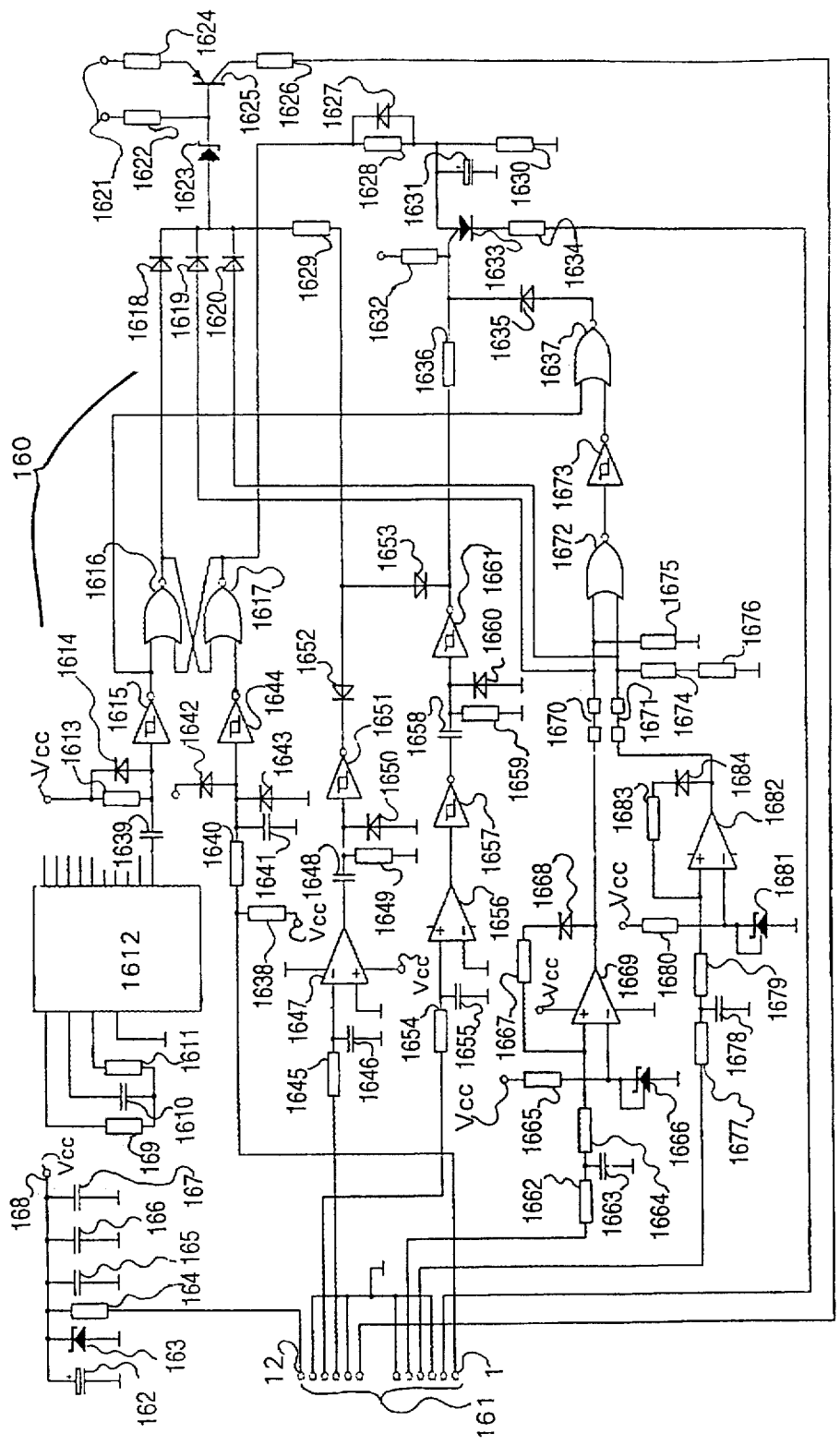
FIG. 16: illustrates the circuit of the control section for an energizer according to FIG. 15.

Connectors 1221 (12 V supply, 1222 (enable charging of main capacitors) 1227 (gate of SCR), 1228 (zero-crossing of mains signal from within doubler), 1260 (zero-crossing of mains signal from transformer) and 1232 (ground) are connected to a control board similar to that of FIG. 16.

Connectors 1238 and 1246 are linked to a separate winding on the output transformer and are coupled to three dividing circuits which are connected to a display circuit showing the output level. (In the 6 Joule energizer which has a simpler display, connectors 1252 and 1258, and the associated circuits are not provided.)

24 JOULE CIRCUIT

Figure 13:
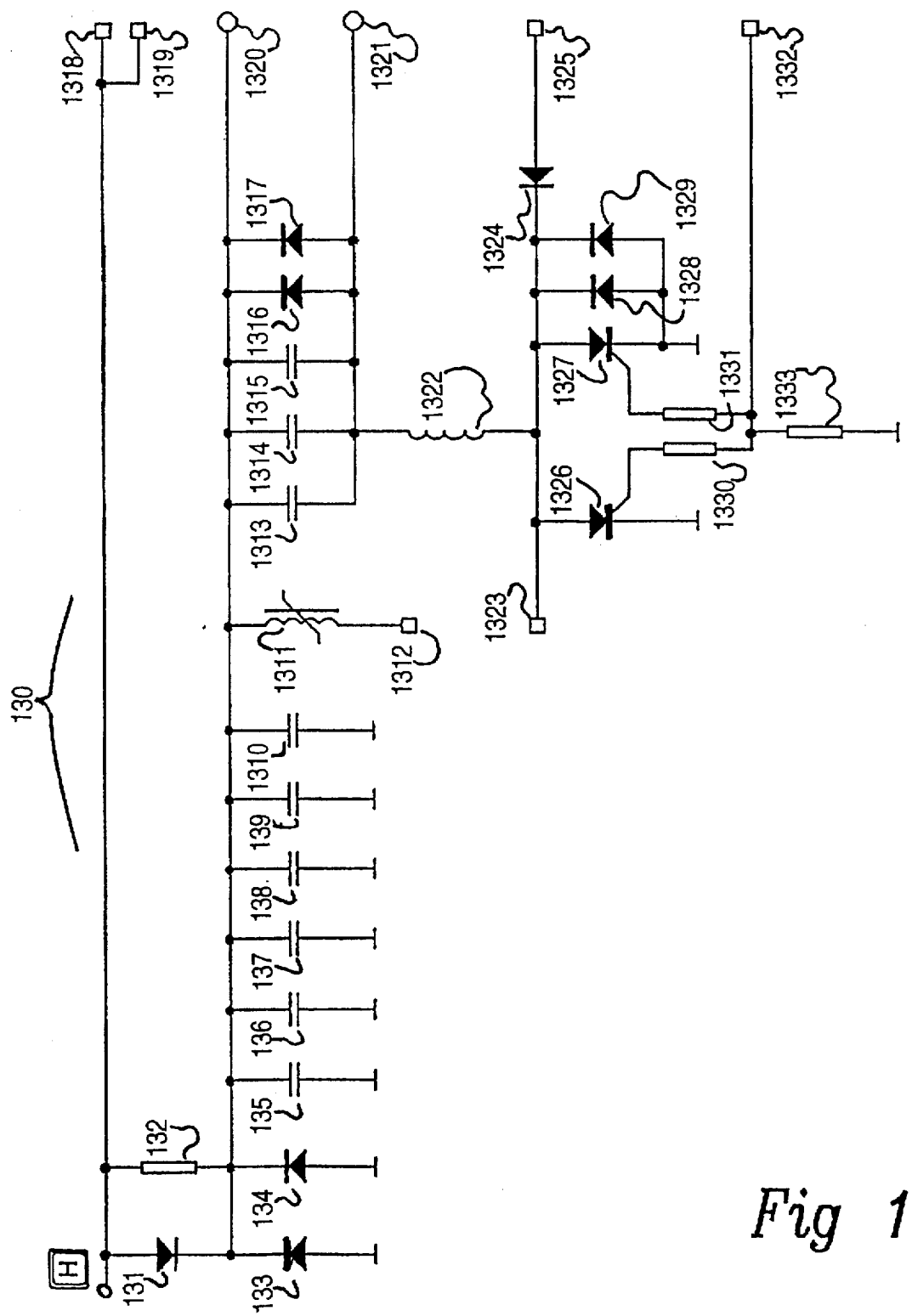
FIG. 13: illustrates a circuit diagram for a 24 Joules energizer according to this invention, including a saturable reactor.

FIG. 13 illustrates the pulse generation circuitry (as a non-limiting example) for a 24 Joule unit. Charging current at a voltage of about 750 V is provided from time to time to point H from the circuit of FIG. 12. Capacitors 135, 136, 137, 138, 139, and 1310 are the main storage capacitor (cf 703 in FIG. 7) and capacitors 1313, 1314, and 1315 correspond to 704 of FIG. 7. Note that the ratio of capacity of the respective capacitor banks is approximately 2:1—as also in FIG. 14. The primary of the iron powder-cored step up transformer (not shown) is attached to connectors 1320 and 1321. Preferably a 10 nF capacitor is connected across the output of this transformer in order to minimise radiated RFI, and optionally means to protect the energizer against the effects of lightning strike may also be included.

A low-resistance high-power resistor (or preferably a pair of such in parallel) is placed between points 1312 and 1323 to dissipate the remains of the charge and this corresponds to 708 of FIG. 7. The saturable inductor 1311, which serves to dump the remaining charge in the capacitors corresponds to 702/FIG. 7 and it preferably includes a pair of windings in parallel. 1322 (cf 705) limits the rate of rise of the pulse waveform. The pair of thyristors 1326 and 1327 (preferably type S4016NH and corresponding to 707 of FIG. 7) are turned ON by a drive pulse from the control board, via connector 1332 (corresponding to line 710). Diodes 1328 and 1329 (see 706 of FIG. 7) trap any tendency for resonant currents to oscillate to and fro in either capacitances 1313, 1314, 1315 with inductance 1322, or with the output transformer. Diodes 133, 134, and also diodes 1316 and 1317 also suppress reverse flow and thereby serve to construct the termination of the pulse produced by this energizer. Connector 1325 monitors the action of the main thyristors, while 1318 and 1319 are for monitoring the DC bus for the presence of a charge.

6 JOULE ENERGIZER

Figure 14:
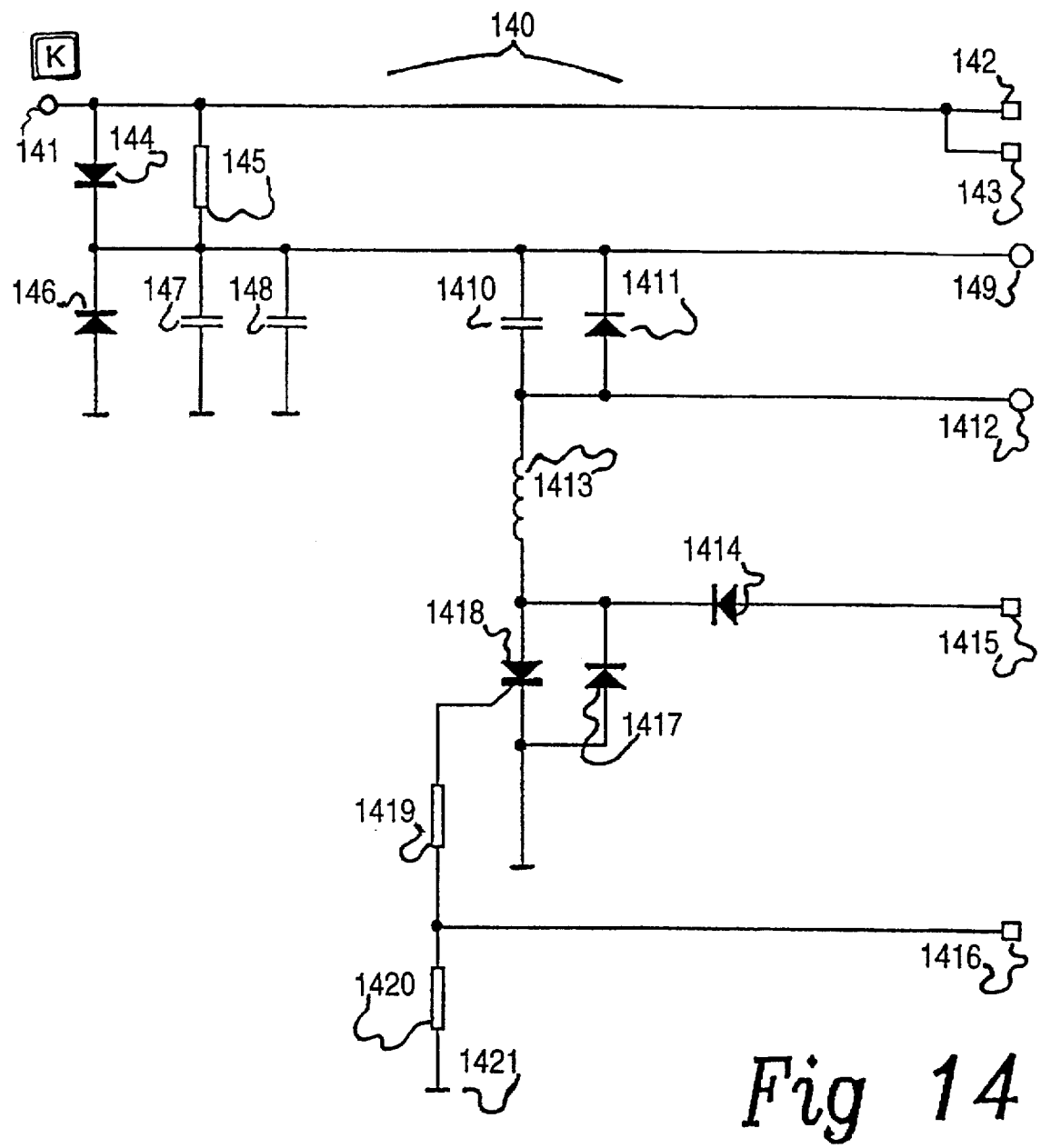
FIG. 14: illustrates a circuit diagram for a 6 Joules energizer according to this invention, wherein the saturable reactor is the output transformer.

FIG. 14 illustrates one example circuit (corresponding to FIG. 12 and FIG. 13) for a 6 Joule unit, to be connected to the power supply of FIG. 12 at K, in which the step-up or output transformer itself is designed to become saturated and thereby have the effect of discharging the capacitor and causing the downward slope of the constructed pulse. Thus 1311, and the resistor between 1312 and 1323 of FIG. 13 are not provided, and the other semiconductors are not duplicated. In this case the capacity of the main storage capacitor 147 and 148 is about one quarter of that of FIG. 13, thus giving about one quarter of the stored charge of the 24 Joule unit. The capacity of the secondary capacitor 1410 is reduced in proportion. Other components may be matched by position.

Table of parts values, for FIGS. 12, 13 and 14.
(Cnn. = Connector)

FIG. 12

| | |
|---|---|
| 121 | Cnn. PD1 |
| 122 | Cnn. PD2 |
| 123 | fuse |
| 124 | 2R7-2W |
| 125 | Varistor 275 V |
| 126 | 0.1 µF |
| 127 | Transformer |
| 128 | 330K |
| 129 | 0.1 µF |
| 1210 | 180K |
| 1211 | 6 µF |
| 1212 | 47R-5W |
| 1213 | 47R-5W |
| 1214 | BYW56 |
| 1215 | 12R-5W |
| 1216 | Labels |
| 1217 | 270K |
| 1218 | BYW56 |
| 1219 | 3R3 |
| 1220 | 3R3 |
| 1221 | Cnn. J1 |
| 1222 | Cnn. J2 |
| 1223 | 1N4007 |
| 1224 | BT139-800 |
| 1225 | 3R3 |
| 1226 | 3R3 |
| 1227 | J11 |
| 1228 | J13 |
| 1229 | S4016NH |
| 1230 | BYW56 |
| 1231 | 100K |
| 1232 | J2, J3 = reference |
| 1233 | 1N4148 |
| 1234 | 1N4148 |
| 1235 | 1N4148 |
| 1236 | 1N4148 |
| 1237 | internal ground/reference |
| 1238 | Cnn. PD5 |
| 1239 | 1N4148 |
| 1240 | 10R |
| 1241 | 100K |
| 1242 | 1 µF |
| 1243 | 47K |
| 1244 | Cnn. J5 |
| 1245 | Cnn. J4 |
| 1246 | Cnn. PD6 |
| 1247 | 1N4148 |
| 1248 | 10R |

17

-continued

Table of parts values, for FIGS. 12, 13 and 14.
(Cnn. = Connector)

| | |
|---|---|
| 1249 | 330K |
| 1250 | 10 µF |
| 1251 | 680K |
| 1252 | Cnn. J6 |
| 1253 | 1N4148 |
| 1254 | 10R |
| 1255 | 330K |
| 1256 | 10 µF |
| 1257 | 680K |
| 1258 | Cnn. J7 |
| 1260 | Cnn. J10 |

FIG. 13

| | |
|---|---|
| 131 | BYW56 |
| 132 | 100R |
| 133 | 6A10 |
| 134 | 6A10 |
| 135 | 30 µF |
| 136 | 30 µF |
| 137 | 30 µF |
| 138 | 30 µF |
| 139 | 30 µF |
| 1310 | 30 µF |
| 1311 | L1 (see text) |
| 1312 | Cnn. JR1 to resistor |
| 1313 | 30 µF |
| 1314 | 30 µF |
| 1315 | 30 µF |
| 1316 | 6A10 |
| 1317 | 6A10 |
| 1318 | Cnn. J14 |
| 1319 | Cnn. J15 |
| 1320 | Cnn. PD3 |
| 1321 | Cnn. PD4 |
| 1322 | 40 µH |
| 1323 | Cnn. JR2 to resistor |
| 1324 | BYW96E |
| 1325 | Cnn. J8 |
| 1326 | S4016NH |
| 1327 | S4016NH |
| 1328 | 6A10 |
| 1329 | 6A10 |
| 1330 | 3R3 |
| 1331 | 3R3 |
| 1332 | Cnn. J9 |
| 1333 | 100R |

FIG. 14

| | |
|---|---|
| 141 | Cnn. |
| 142 | Cnn. J14 |
| 143 | Cnn. J15 |
| 144 | BYW56 |
| 145 | 100R |
| 146 | 6A10 |
| 147 | 20 µF |
| 148 | 20 µF |
| 149 | Cnn. PD3 |
| 1410 | 20 µF |
| 1411 | 6A10 |
| 1412 | Cnn. PD4 |
| 1413 | 40 µH |
| 1414 | BYW96E |
| 1415 | Cnn. J8 |
| 1416 | Cnn. J9 |
| 1417 | 6A10 |
| 1418 | S4016NH |
| 1419 | 3R3 |
| 1420 | 100R |
| 1421 | Ground/reference |

EXAMPLE 3

Another 6 Joule Energizer

Figure 15:
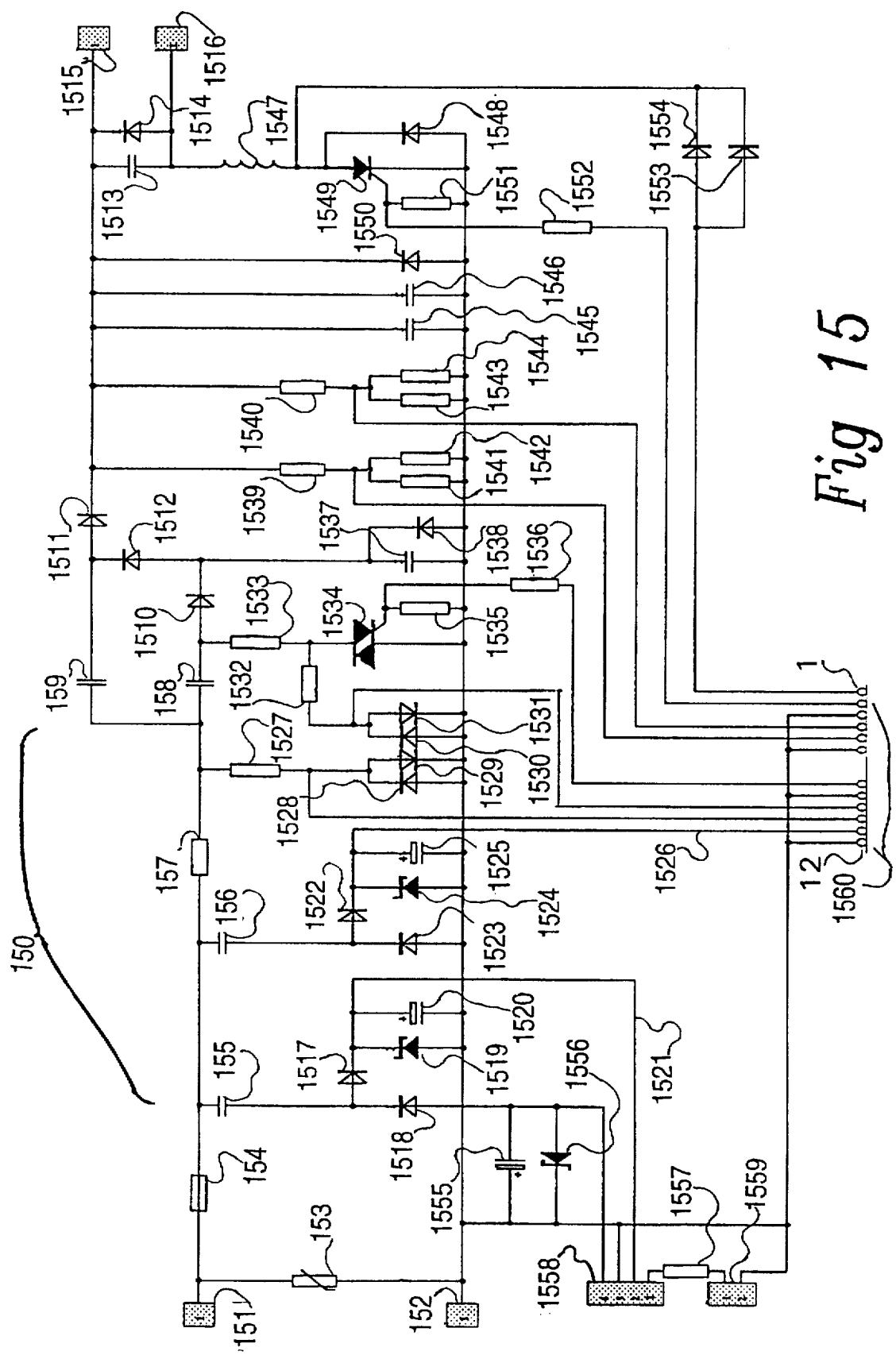
FIG. 15: illustrates another circuit for a 6 Joule energizer in which a diode multiplier raises the incoming mains voltage for the internal bus.

Referring to FIG. 15, showing the 6 Joule energizer 150; the mains input is applied to connectors 151 and 152, with 152 preferably connected to the neutral line B. The energizer can be regarded as being made of two parts:—one being means to provide a suitably controlled and limited DC charging current to capacitors across a line leading to output connectors 1511 from time to time, and the other being means to discharge those capacitors in a controlled fashion. Much of the apparent complexity of this circuit results from implementation of means to satisfy both safety standards and electromagnetic emission standards, though at the same time the improvements assist effectiveness. Safety standards require provision of a fail-safe circuit incapable of producing a life-threatening output (such as a raised discharge frequency) regardless of failure of any part. Accordingly there is frequent duplication of components and of functions.

The primary of the output transformer as previously described is connected to 1515 and 1516. A feedback winding on the power transformer is connected at connector 1559 to the control card, and a status display is connected to 1558. The control card, FIG. 16, is connected to a 12-pin connector 1560 and provides a number of control functions which will be discussed below.

Pulse Shaping Components

Components particularly relating to the waveform control aspect, for the pulses developed by the energizer of this invention are at the top right of FIG. 15 and include:

(A) 1545 and 1546, primary charge storage electrolytic capacitors across the DC bus and the earth or reference line which store the energy prior to discharge in a manner analogous to C1 of FIG. 2. While two capacitors in parallel are shown here, a greater or lesser number may be used for pragmatic reasons such as availability, compaction, or adjustment of capacitance, (B) the SCR 1549, closure of which initiates the discharge, (C) capacitor 1513 (analogous to C2 of FIG. 2) and preferably of about half the capacitance of the combination of 1545 and 1546 which absorbs the "rebound", (D) diode 1514 which conducts at the end of the rebound and traps any significant excursions of the energizer output otherwise likely to go below the baseline, (E) diode 1550 which traps any momentary reversals of potential on the bus, and (F) inductor 1547 which limits the rate of rise of the primary current In this relatively small energizer the core of the output transformer itself is saturable.

Providing Charging Power

The circuit of FIG. 15 provides means to raise a nominally 110 volts AC mains input to a higher voltage, so that the energizer can be used in a greater range of countries. The mains supply connected at 151 has possible transients (from either direction) trapped in the voltage-dependent resistor 153 and is passed through a fuse 154 to the circuit.

Low-voltage split-polarity DC is supplied to the status display via connector 1558 from the internal power supply comprising diodes 1517, 1518, zener diodes 1519 and 1556, and capacitors 1520 and 1555—the latter providing a negative polarity.

Low-voltage DC for the control board of FIG. 16 is generated within the supply including diodes 1522, 1523, with zener diode 1524, and capacitor 1525. Both low-voltage supplies are driven from the mains via coupling capacitors 155 or 156.

A low-voltage signal carrying mains zero-crossing information is developed by crossed diodes 1528 and 1529 in series with a resistor 1527 across the mains supply. Another similar circuit (comprising diodes 1530, 1531 and resistor 1527 joined to the TRIAC device 1534 indicates to the control circuit whether the TRIAC is open or closed. These devices may fail in the "closed" state and in this circuit that would result in constant provision of a charging voltage.

Resistor 157 serves to limit the peak charging current intended for 1445 and 1546. It is in series with the mains input and a controlled voltage tripler arrangement (diodes 1510, 1512, 1511 and 1538 together with capacitors 158, 1537 and 159, which is controlled by the TRIAC 1534. Only when 1534 is closed can the multiplier diode chain be activated and provide power. This diode chain can be called a "Controlled Quad Doubler". Control of TRIAC 1534 provides the control board with the ability to limit the duration of charging of 1545 and 1546 so that the energizer can emit pulses during only a limited period.

Resistors 1535 and 1536 limit the gate current of TRIAC 1534 and provide a return to ground for any remaining or leakage current The duplicated resistor networks 1539 with 1541 and 1542, and 1540 with 1543 and 1544 serve to sample the voltage on the DC bus. The duplicated diodes 1553 and 1554 allow the control board to detect negative-going excursions of the output.

Resistors 1551 and 1552 limit the gate current supplied to the discharge silicon controlled rectifier (SCR) 1549 and provide a return to ground for any remaining or leakage current.

Control Circuit

This circuit 160, shown in FIG. 16, is intended to provide a repetitive sequence of control signals to the main board and also to monitor for at least some fault conditions.

The normal sequence of operations is that from time to time a clock pulse initiates a charging sequence in which a state of full charge is caused and then sensed. This sets off the discharge solid-state switch Q1, hence the energizer emits a pulse.

The timer circuit (an oscillator/divider type 4040—1612 with resistors 169, 1611 and capacitor 1610) generates a periodic clock signal at its Q14 output, buffered through 1615. One branch which is passed through 1616, a diode 1618 forming part of an OR gate, and transistor 1625, causes the main charge TRIAC (1534) to close and start charging the capacitors. 1621 is a connection to the control board power supply (168).

Completion of charging to a desired level—a process which may take 0.5–1.5 seconds approximately—is sensed by a comparator comparing the voltage across a reference diode with that of the bus A. This circuit is duplicated to minimize the risk of failure.

A resistively divided fraction of the bus voltage is provided at pin 5 (& 4) of the conenctor 161 to the control board, where it is filtered with resistor 1662 (& 1677) and capacitor 1663 (1678), and compared within the amplifier 1669 (& 1682) against the voltage across a reference diode 1666 (& 1681). The amplifiers have positive feedback through resistor 1667 (& 1683) and diode 1668 (& 1684). The output, which on going positive signals a sufficient charge is taken through a link 1670 (& 1671), to an OR gate diode 1619 (& 1620) and to the base of transistor 1625 via a threshold-setting zener diode 1623. The output is also used to inhibit the charging current after passing through 1672 (which combines both signal paths), buffer 1673, OR gate 1637, and diode 1635. OR gate 1637 is used to include a disable-charging function once the clock signal has reverted to its LOW state.

We prefer to cause the SCR and the TRIAC drives (FIG. 15) to change state only when the incoming mains supply is at zero (or substantially so; twice per cycle) so that transient emissions down the mains input lead are minimized. Accordingly a signal carrying zero-crossing information is created within the circuit of FIG. 15—linked to pin 10 of connector 161 through resistor 1654 to amplifier 1656 (wired for high gain) and buffer 1657 (which as a Schmitt trigger improves the transition speed of the signal), then 1660 and 1661 acting as a half-wave rectifier for the pulses. The resulting pulses are split; some pulse current goes through 1653 and 1629 to the diode OR gate at the base of transistor 1625 while the remainder passes through resistor 1636 to the trigger of programmable unijunction transistor 1633. A time constant about this device, of nominally 700 mS, assists in minimizing the risk of rapid firing by the energizer.

A second zero-crossing sensor, sampling voltage from across the TRIAC switch of FIG. 15, is connected through line 9 of connector. 161 to a second "pulse extraction device" incorporating amplifier 1647 with supporting components, which is however wired in inverse polarity to the first "pulse extraction device" because one Schmitt buffer stage is absent from this second chain. The output from buffer 1650 is summed with that from buffer 1660 at the junction of diodes 1652 and 1653.

DC power to run the components on the control board is provided at the top left corner, where zener diode 163 shunt-regulates incoming DC (through current-limiting resistor 164) and the capacitors 162, 165, 166 and 167 smooth the power and provide local reserves of current about the circuit board.

The operation of the circuits of Examples 2 and 3 may be summarized in these steps—assuming that the equipment is connected and powered up—:

(1) after a certain time, typically 1 second, (as determined principally by the oscillator 1612, the output of which is logic-gated for enabling or disabling purposes in relation to safety) instigating a charge of the main capacitor bank by turning on the TRIAC 1224 of FIG. 12 or 1534 of FIG. 15 and (for FIG. 12) at the same time turning ON the thyristor 1229. Diode 1218 in FIG. 12 is particularly useful for concealing the slow turn-off transients generated within the TRIAC 1224.

(2) When the charge on the capacitor bank has reached a suitable value, as detected by the duplicated voltage-sensing circuits connected with resistive dividers to the DC bus (ICs 1669, 1682 and reference diodes 1666, 1681), the discharge thyristor (1326/1327, 1418, or 1549) is caused to come ON as a result of gate current supplied from the programmable unijunction transistor (PUT) 1633 of FIG. 16. In more detail a mains phase-determining circuit fed with zero-crossing or polarity-indicating pulses from line 1526, so that an output pulse is delivered within a period when the mains input is negative so that the rectifying diode 1214 (or the multiplier chain 1510, 1511, 1512, and 1538 is substantially reverse-biased so that interference from the pulse is blocked from entering the mains supply.

(3) The actual generation of the raised cosine wave has been described previously.

(4) The circuitry (IC 1647 with ancillary components) connected to the diodes 1530/1531, or to connector 1228 senses the action of the TRIAC controlling the mains rectifier as a further safety feature, and is provided to protect against continued re-triggering action of the voltage-doubling circuit which might happen if the bus was permanently powered and the capacitors were usually in a charged state.

(5) The circuitry connected to 1553/1554, to 1414, or to 1324 senses the action of the main thyristor(s) as a further safety feature and is provided to protect against failure of these devices to fire normally.

(6) A display board is provided in the case of the more powerful energizer, for the purpose of indicating the approximate delivered power. Inputs PD5 and PD6 are fed through three scaling circuits to provide low, medium, and high power level indication. A suitable display board has a light-emitting-diode type output.

These detailed circuits are provided by way of example only and represent one implementation of the principles expressed in FIGS. 7 and 8. Parts values for FIGS. 15 and 16 generally correspond to those for FIGS. 12, 13, and 14, or are commonplace variants such as integrated circuits of the well-known CD. or HE. families.

The circuit(s) described herein may be packaged in a secure box and provided with connectors for joining to earth and the electric fence, and a cable to the mains supply. An optional indicator indicates the amplitude of the output pulse and so whether the energizer is driving into a partially shorted load (as with wet or defective insulators) or a normal load.

A variant having a clock section which causes the energizer to generate pulses in a pseudo-random fashion; that is, not at a set rate of say one per second but at any time between a first minimum safe period and a second maximum effective period may be more use in deterring some types of animal from rushing the fence.

When variants of these circuits are not powered from the AC mains, but from other sources, modifications may be made to the means for generating a high DC bus voltage of the order of 750 V. For example a boost DC to DC converter stage may be provided if the circuit is run from a battery source. If the device is operated from a 400 Hz supply as generally used in aircraft, some parts values may be changed to optimise its operation at this frequency.

Other possible applications for this type of circuit outside electric fence energizers include: firing xenon flash lamps where on-board aircraft radio beacon receivers in particular would benefit from the low harmonic content of the pulse, and some types of pulsed motor drive.

Finally, it will be appreciated that various alterations and modifications may be made to the foregoing without departing from the scope of this invention as claimed.

We claim:

1. A circuit for an electric pulse generator suitable for use in an electric fence energizer, capable from time to time of generating or constructing one or more substantially unipolar pulses of power having a controlled shape, comprising a control means capable of initiating and controlling the generation of a pulse, a shaping means capable of determining the shape of the pulse when generated at a first low voltage, wherein the amplitude of the pulse has a rising phase in which it rises from a base level up to a peak amplitude gradually at first, then more rapidly, then slows to a rounded peak, then falls in a falling phase which is substantially a mirror image of the rising phase, so that a smooth and substantially symmetrical pulse outline is generated; and a pulse transforming means to transform the pulse so generated into a pulse at a second, generally higher voltage without substantial alteration to the shape of the initially generated pulse.

2. A circuit as claimed in claim 1, wherein the shaping means comprises a circuit for generating a pulse having a controlled shape as claimed in claim 1, wherein the rising phase and the peak amplitude are controlled by passing a charge from a first chargeable electrical storage means into a second chargeable electrical storage means, which is initially uncharged, through a means possessing effective inductance and through the pulse transformer means and through a first switching means, and then controlling the rate of fall of the pulse from the peak amplitude down to the base level by returning at least a part of the charge from the second storage means back to the first, now relatively discharged, storage means and into a charge dissipating means, whereupon any remaining charge within the first chargeable means will be substantially dissipated within the charge dissipating means.

3. A circuit as claimed in claim 2, wherein the shaping means further comprises a circuit having at least said one first chargeable electrical storage means connected so as to receive a charging current from a controlled source of electricity and become charged to a first voltage, thereby holding an effective charge; at least said one second chargeable means connected in parallel with the pulse transforming means but in series with the means possessing effective inductance and also in series with the first switching means; the second chargeable means also being connected in parallel with the pulse transforming means; a discharging means in series with the charge-dissipating means and in parallel with the first chargeable means; and actuating means to control the switching means.

4. A circuit as claimed in claim 3, wherein the control means includes means to cause generation of each pulse to occur in a sequence and to minimize the risk of inadvertent generation of spurious pulses, said control means including means to control and monitor a source of charging current, means to monitor the amount of charge placed within the first chargeable means, together with means to initiate each pulse substantially as soon as the charge reaches a predetermined level, and means to cause a pulse to be generated after a certain time even if the predetermined charge is not accomplished.

5. A circuit as claimed in claim 3, in which the first chargeable electrical storage means comprises at least one capacitor and has about twice the storage capacity of the second chargeable electrical storage means, which also comprises at least one capacitor.

6. A circuit as claimed in claim 3, in which the pulse transforming means is a transformer having a primary:secondary turns ratio capable of providing pulses at an effective output voltage and which pulse transforming means has a nonconducting ferromagnetic core suitable for high-frequency use.

7. A circuit as claimed in claim 4, further including means to sense the instantaneous phase of an alternating-current mains supply in order to limit the initiation of charging to the zero-crossing intervals of the alternating-current mains supply and means to limit the initiation of a pulse to those periods when the alternating-current mains supply link is of a polarity such that a rectification means placed between the alternating-current mains supply and a DC bus is in a reverse biased state during the generation of an output pulse.

8. A circuit as claimed in claim 2, in which the charge dissipating means is a saturable inductor in series with an energy-dissipating means.

9. A circuit as claimed in claim 2, in which the charge dissipating means is provided as an intrinsic property of the pulse transforming means which is provided with a saturable ferromagnetic core.

10. A circuit as claimed in claim 2, in which the charge dissipating means is a switch in series with an energy-dissipating means.

11. A circuit as claimed in claim 2, in which further means to shape each pulse comprise one or more means to block the reverse flow of current and thereby minimize reversal of the polarity of the waveform.

* * * * *